United States Patent [19]
Tam

[11] Patent Number: 5,900,759
[45] Date of Patent: * May 4, 1999

[54] DYNAMIC-TO-STATIC CONVERTOR AND STATICIZED FLOP INCLUDING THE SAME

[75] Inventor: Kenway W. Tam, Cupertino, Calif.

[73] Assignee: Sun Microsystems, Inc., Palo Alto, Calif.

[*] Notice: This patent is subject to a terminal disclaimer.

[21] Appl. No.: 08/883,546

[22] Filed: Jun. 26, 1997

[51] Int. Cl.⁶ .................................................. H03K 3/037
[52] U.S. Cl. ......................... 327/201; 327/211; 327/212; 326/28; 326/98
[58] Field of Search .................................... 327/199–203, 327/208–214, 218; 326/98, 28, 57, 58

[56] References Cited

U.S. PATENT DOCUMENTS

| | | | |
|---|---|---|---|
| 5,495,191 | 2/1996 | Lev et al. | 327/51 |
| 5,576,651 | 11/1996 | Phillips | 327/202 |
| 5,748,015 | 5/1998 | Tam | 327/51 |
| 5,764,089 | 6/1998 | Partovi et al. | 327/212 |
| 5,774,005 | 6/1998 | Partovi et al. | 327/218 |
| 5,841,304 | 11/1998 | Tam | 327/161 |

*Primary Examiner*—Timothy P. Callahan
*Assistant Examiner*—Tuan T. Lam
*Attorney, Agent, or Firm*—Jones, Volentine, Steinberg & Whitt, L.L.P.

[57] ABSTRACT

A staticized flop circuit converts a dynamic signal appearing across the output of a logic circuit into a static signal, and includes a dynamic-to-static convertor which minimizes glitching in the static output. The dynamic-to-static convertor includes a pull-down device, operatively coupled between an output node and a ground, which is closed while an input node is at a precharge potential and which is open while the input node is at a ground potential, and a pull-up device, operatively coupled between a source voltage and the output node, which is closed while the input node is at the ground potential and which is open while the input node is at the precharge potential. The invertor also includes a pull-down path shutoff device, operatively coupled between the output node and the ground in series with the pull-down device, which is closed during each first phase of a clock signal and which is open during each second phase of the clock signal, and an activation device, operatively coupled between the output node and the series connection of the pull-down device and the pull-down shutoff device, which is closed during each first delayed phase of a delayed clock signal and which is open during each second delayed phase of the delayed clock signal.

11 Claims, 7 Drawing Sheets

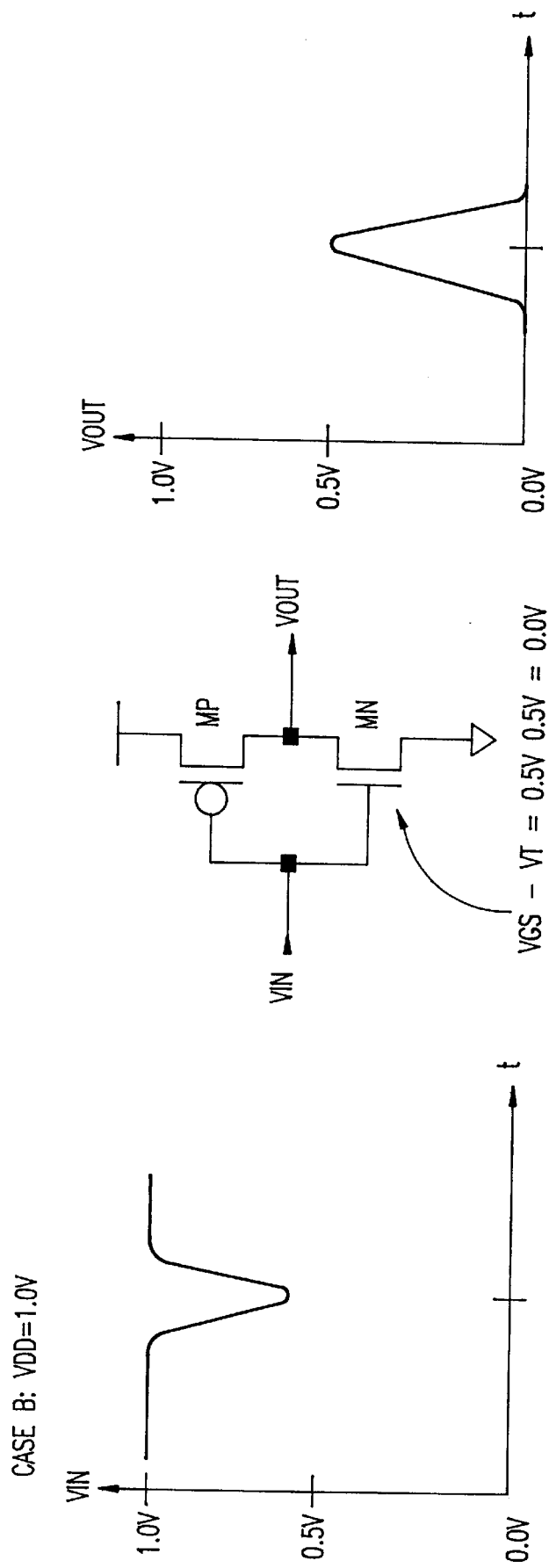

DYNAMIC-TO-STATIC CONVERTOR AND STATICIZED FLOP INCLUDING THE SAME

BACKGROUND OF THE INVENTION

1. Field of the Invention

The present invention generally relates to a staticized flop circuit, and more particulary, to a dynamic-to-static converter of a staticized flop circuit which reduces glitching in a static output thereof.

2. Description of the Related Art

A conventional staticized flop circuit, an example of which is shown in FIGS. 1 and 2, functions to periodically evaluate a dynamic logic signal to produce a corresponding static output signal. This is necessary in the case where a dynamic circuit output is to interface with a static circuit, and thus the dynamic signal output must be staticized for application to the static circuit. FIG. 1 is a functional block diagram of such a circuit, whereas FIG. 2 is an exemplary component level circuit diagram of the same.

A logic circuit 102 receives at least one input A, B, . . . X to perform a logic operation on the same. The logic circuit 102 may be any logic circuit, such a MUX for example, that produces a dynamic output. In the example of FIG. 2, the logic circuit is implemented by transistors ML1 and ML2 which produce the logical NAND of inputs A and B at a dynamic node EVAL.

Together with the logic circuit 102, a precharger D 104, a latch D 106 and a ground switch 108 form a dynamic circuit. The precharger D 104 serves to precharge the dynamic node EVAL during each low pulse of a clock signal CLK, and may be implemented by a voltage source Vdd and a transistor MPRE as shown in FIG. 2. Conversely, the ground switch 108, which may be implemented by a transistor MGS, functions to conditionally discharge the dynamic node EVAL during each high pulse of the clock signal CLK. The discharge is conditional since the transistors ML1 and ML2 of the logic circuit 102 must be closed as well. The latch 106 may be composed of forward invertor INVD1 and feedback invertor INVD2, and functions to hold the voltage of the dynamic node EVAL for the case of EVAL-to-high.

The dynamic to static conversion takes place in the convertor 110. As shown in FIG. 2, the convertor may be formed of pull-down transistor MC1, an activation transistor MC2, and a pull-up transistor MC3. MC1 and MC3 basically form an inverter which is activated and deactivated by MC2. That is, if MC2 is on (activated) and EVAL is high, then MC3 is off and MC1 is on, thus pulling down the voltage at node Y to low. In contrast, if EVAL is low while MC2 is on, then MC3 is on and MC1 is off, thus pulling up the voltage at node Y to high. Also, when MC2 is off (deactivated), EVAL is precharge to high, and thus MC3 is off and the path to MC1 is cut off by MC2, and no change in the node Y potential takes place.

At the output of the dynamic-to-static convertor is a latch 112 and an output buffer 114. The latch 112 functions to latch the potential at static node Y and may include a forward invertor INVS1 and a feedback invertor INVS2. The output buffer 114 may be implemented by an output inverting buffer INVB.

In the circuits of FIGS. 1 and 2, the static node Y undergoes a transition responsive to an input transition. On the other hand, even in the absence of an input transition, the dynamic mode EVAL is precharged and is conditionally discharged every CLK cycle. This is described in greater detail below. In the discussion herein, logic "0" is low and is ground Vss, whereas logic "1" is high and is supply voltage Vdd.

First, a "precharge phase" is described which takes place when the clock CLK is low. Since CLK is low, MPRE is turned on and dynamic node EVAL is charged to high. This in turn puts MC3 in an off state and MC1 in an on state. However, since CLK is low, MC2 is off, and therefore both the pull-up path and the pull-down path of the converter 110 are shut off. The static node Y thus maintains its value, the voltage of which is held by the latch 112. When the CLK goes low at the precharge phase, the pulldown path of the converter is immediately shut-off. This action then isolates static node Y from any transition at dynamic node EVAL, and thus staticizes the circuit output.

The "evaluation phase", which occurs when the CLK goes high, will now be described. It is assumed for explanation purposes that the static node Y is initialized to high.

In a first case, either one or both of ML1 and ML2 is off, and thus EVAL remains high. That is, MGS turns on, but the pull-down path for node EVAL is cutoff by logic circuit 102. Also, the high dynamic node EVAL keeps MC1 on (and MC3 off), while the CLK turns on MC2. The pull-down path of node Y is thereby established, discharging node Y to low and switching the output to high.

In a second case, both ML1 and ML2 are on, and CLK turns on MGS to activate the pull-down path for node EVAL, thus causing EVAL to go low. At the same time, the CLK turns on MC2 which activates the pull down path for node Y. Thus, node EVAL and node Y are discharged almost simultaneously. When the dynamic node EVAL hits a threshold voltage, MC3 overpowers MC1, and the static node is charged back up to high, causing the output to go low.

It takes time for the dynamic node EVAL to discharge to the point where MC1 is shut off to block the pull-down action of node Y. This causes the node Y to glitch to low prior to being restored to high. This glitch is at least partially caused by the fact that the clock-to-q delay for the flop is not balanced for the two edges as shown below:

$$clk(r) \rightarrow out(r) = y(f) + out(r) = 2 \text{ gate delay}$$

$$clk(r) \rightarrow out(f) = eval(f) + y(r) + out(f) = 3.5 \text{ gate delay}$$

where clk(r)→out(r) is the delay from the rise of CLK to the rise of the output; y(f) is a 1-gate delay occurring during a falling of node Y to low; out(r) is a 1-gate delay occurring during a rise of the output to high; clk(r)→out(f) is the delay from the rise of CLK to the fall of the output; eval(f) is a 1.5 gate delay occurring during a falling of node EVAL to low; y(r) is a 1-gate delay occurring during a rising of node Y to high; and out(f) is a 1-gate delay occurring during a falling of the output to low.

In the equations above, eval(f) is a 1.5 gate delay. In fact, however, eval(f) can range from 1 to 2 gate delays depending on the number of nmos devices (embedded logic) contained in the evaluation stack of the logic circuit 102. A 2-device stack would equate to 1 gate delay, a 3-device stack would equate to a 1.5 gate delay, and a 4-device stack would equate to a 2 gate delay.

Glitching results at node Y when the previous value at node Y is high and the EVAL node evaluates to low. In this case, a zero-gate delay occurs in the activation of switch MC2 (driving by the clock), whereas a 1.5-gate or more delay occurs in the pull-down of node EVAL. This increases the pull-down time of node Y prior to its being pulled back up by action of the pull-up transistor MC3.

Glitching presents problems in several respects. For example, glitching raises power consumption and requires special care when conducting electromigration studies. Moreover, glitching reduces the noise margin for the circuit receiving the flop output.

In addition, the problems of glitch propagation are intensified for low-voltage applications. FIG. 3(a) illustrates the case where Vdd=1.8v, and FIG. 3(b) illustrates the case where Vdd=1.0v. It is a common practice to attempt to counter glitching by skewing the inverter of the output buffer by selecting a stronger (lower beta ratio) pull-down device MN. When Vdd=1.8v as in FIG. 3(a), the voltage drive for MN is Vgs−Vt=0.9v−0.5v=0.4v in the case of a 50% glitch in the node Y potential. By using a larger MN in the inverter, some reduction in the glitch magnitude is possible. On the other hand, at the lower supply voltage Vdd=1.0v as in FIG. 3(b), the voltage drive for MN is Vgs−Vt=0.5v−0.5v=0.0v (again in the case of a 50% glitch in the node Y potential). Thus, regardless of the size of MN, the pull-down device is cutoff and can no longer hold the node down, and the glitch therefore propagates much more easily.

There have been previous attempts to overcome or reduce the effects of glitching. One approach has been to speed up the discharge rate of the EVAL node by selecting large pull-down devices with low fanout for the EVAL node. This approach, while only minimally successful, increases the device area and power usage. Other designs include selecting a high beta ratio (i.e., a stronger pull-up) for MC3 relative to that of MC1 and MC2. Still other designs employ a high fanout on node Y by increasing the size of the output buffer INVB, or (as suggested above) a weakened pull-up (i.e. a small beta ratio) of the output buffer INVB to prevent propagation of the glitch. Nevertheless, any reduction in glitch magnitude is minimal with these approaches.

SUMMARY OF THE INVENTION

It is therefore an object of the present invention to overcome or at least minimize this conventional problems of glitching in the staticized flop circuit.

It is a further object of the present invention to provide a dynamic-to-static converter which may be used, for example, in a staticized flop to avoid or at least minimize glitching of the static output of the staticized flop.

It is still a further object of the present invention to provide a staticized flop circuit which includes the dynamic-to-static convertor of the invention to avoid or at least minimize glitching of the static output of the staticized flop.

In one aspect of the invention, a dynamic-to-static convertor includes: a pull-down switch device, operatively coupled between an output node and a ground, which is closed while an input node is at a precharge potential and which is open while the input node is at a ground potential; a pull-up switch device, operatively coupled between a source voltage and the output node, which is closed while the input node is at the ground potential and which is open while the input node is at the precharge potential; a pull-down path shutoff switch device, operatively coupled between the output node and the ground in series with the pull-down switch device, which is closed during each first phase of a clock signal and which is open during each second phase of the clock signal; a delay circuit which delays the clock signal to obtain a delayed clock signal having first and second delayed phases which are delayed relative to the first and second phases of the clock signal; and an activation switch device, operatively coupled between the output node and the series connection of the pull-down device and the pull-down shutoff device, which is closed during each first delayed phase of the delayed clock signal and which is open during each second delayed phase of the delayed clock signal.

In another aspect of the invention, the delay circuit is comprised of a series connection of first and second invertors.

In yet another aspect of the invention, the pull-down switch device is a first transistor having a gate coupled to the input node; the pull-up switch device is a second transistor having an inverted gate coupled to the input node; the pull-down path shutoff switch device is a third transistor having a gate which receives the clock signal; and the activation switch device is a fourth transistor having a gate which receives the delayed clock signal.

In still another aspect of the invention, a staticized flop circuit is provided which converts a dynamic signal appearing across the output of a logic circuit into a static signal, the output having at least first and second terminals, and which includes: a precharger which is activated during each second phase of a clock signal to charge a first node to a precharge potential and which is deactivated during each first phase of the clock signal, the first node being coupled to the first terminal of the output of the logic circuit; a ground switch which is activated during each first phase of the clock signal to ground the second terminal of the logic circuit and which is deactivated during each second phase of the clock signal; a dynamic-to-static convertor connected between said first node and a second node, said dynamic-to-static convertor comprising: (a) a pull-down switch device, operatively coupled between the second node and the ground, which is closed while the first node is at the precharge potential and which is open while the first node is at a ground potential; (b) a pull-up switch device, operatively coupled between a source voltage and the second node, which is closed while the first node is at the ground potential and which is open while the first node is at the precharge potential; (c) a pull-down path shutoff switch device, operatively coupled between the second node and the ground in series with the pull-down switch device, which is closed during the first phase of the clock signal and which is open during the second phase of the clock signal; (d) a delay circuit which delays the clock signal to obtain a delayed clock signal having first and second delayed phases which are delayed relative to the respective first and second phases of the clock signal; and (e) an activation switch device, operatively coupled between the second node and the series connection of the pull-down switch device and the pull-down shutoff switch device, which is closed during each first delayed phase of the delayed clock signal and which is open during each second delayed phase of the delayed clock signal.

BRIEF DESCRIPTION OF THE DRAWINGS

The above and other objects and features of the present invention will become readily understood from the description which follows with reference to the accompanying drawings, in which:

FIGS. 3(a) and 3(b) are diagrams for explaining the propagation of a glitch at different source voltage magnitudes;

DETAILED DESCRIPTION OF THE PREFERRED EMBODIMENTS

Figure 4:
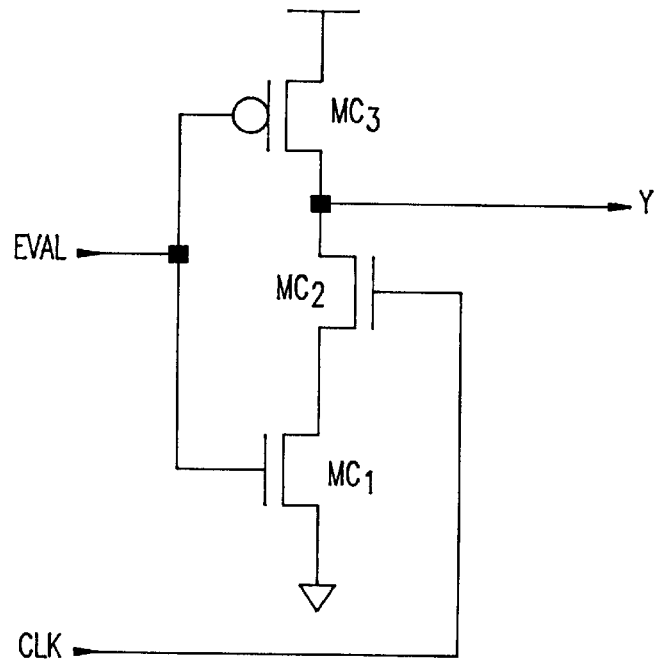
FIG. 4 is a diagram of a conventional dynamic-to-static convertor.

For ease of comparison, FIG. 4 illustrates the dynamic-to-static converter of the conventional device, the operation of which has already be discussed above in connection with FIGS. 1 and 2.

Figure 5:
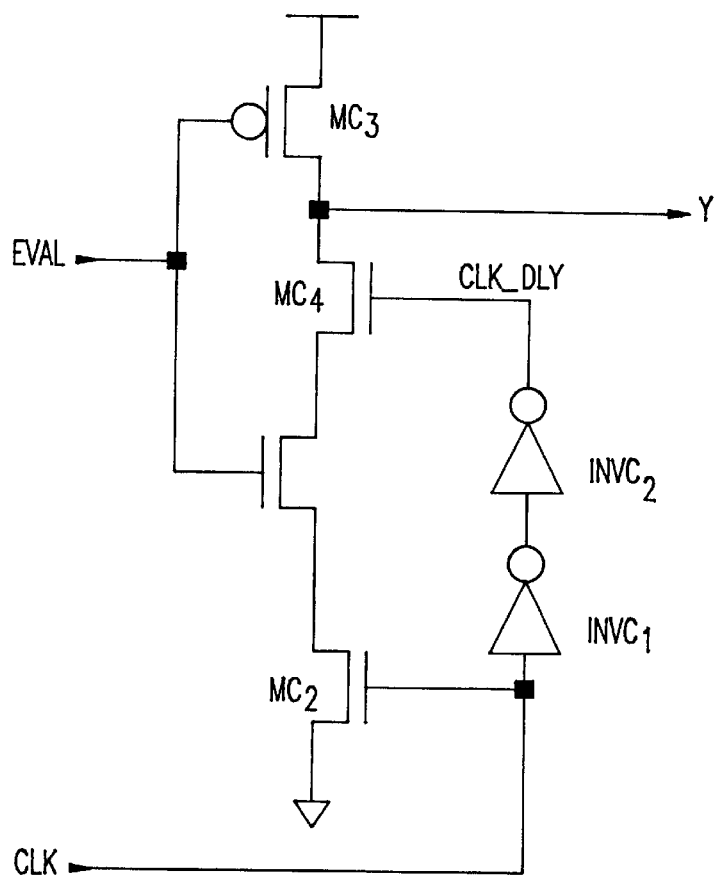
FIG. 5 is a diagram of an example of a dynamic-to-static convertor of the present invention.
Figure 6:
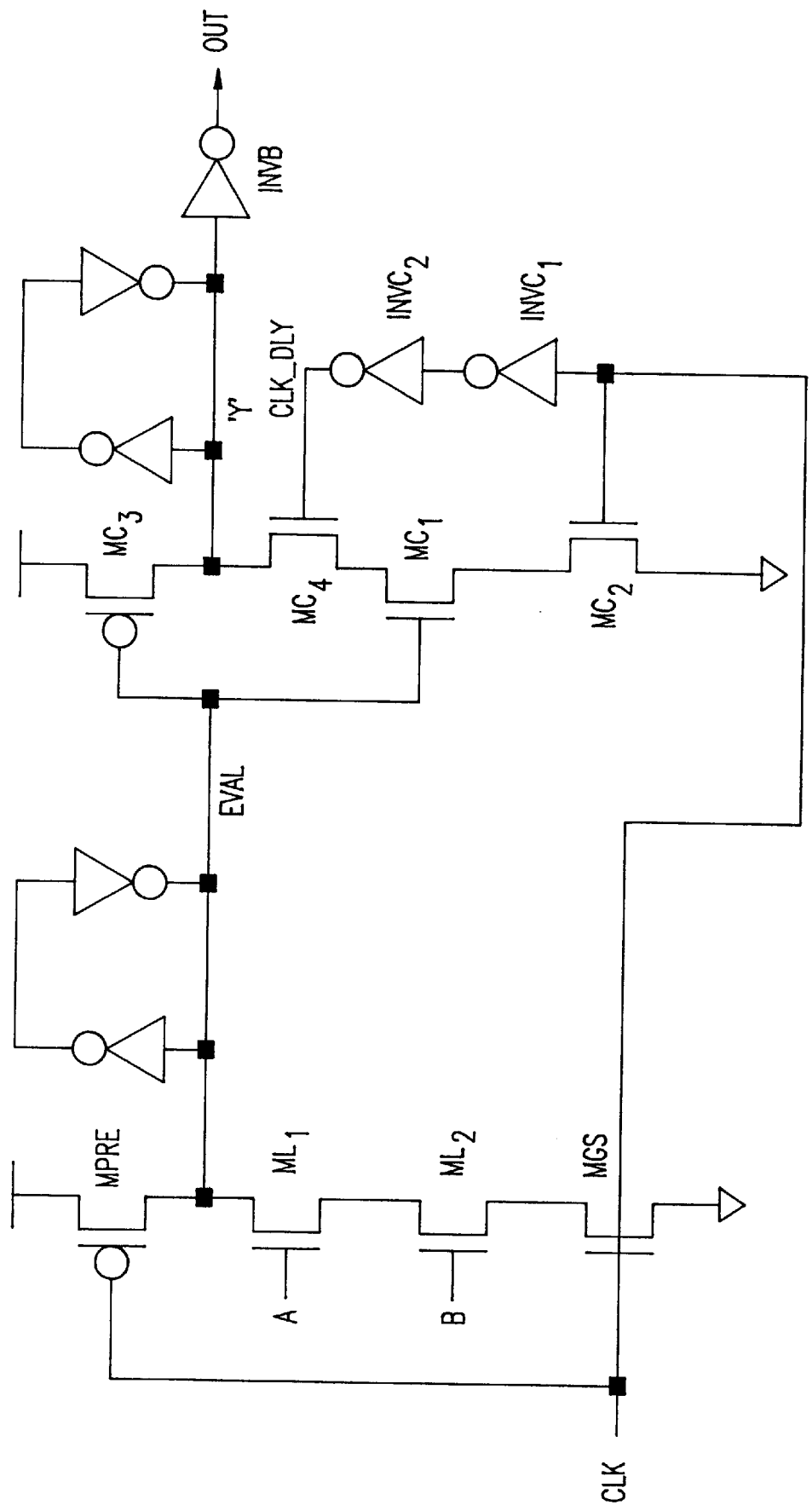
FIG. 6 shows a staticized flop of the invention which includes the convertor of FIG. 5.

FIG. 5 shows an example of the dynamic-to-static convertor of the present invention, and FIG. 6 shows a staticized flop of the invention which includes the convertor of FIG. 5. The invention is characterized by interposing a pull-down delay between the static node Y and the pull-down circuitry. In the embodiment of FIG. 5, this delay is implemented by way of the first and second inverters INVC1 and INVC2 and the activation device MC4. As explained in more detail below, INVC1, INVC2 and MC4 function to delay activation of the Y node pull-down path to allow time for the EVAL node to settle to value which is closer to threshold for activating MC3. In this regard, a pull-down shut off device MC2 is immediately activated by the rise in CLK. The pull-down shut off device MC2 reduces crowbar current in the converter, and shuts off the pull-down path of the convertor immediately when the CLK goes low to isolate node Y from any changes in node EVAL.

Referring also to FIG. 6, the operation of the present invention as exemplified by the embodiment of FIG. 5 will now be described.

In a "precharge phase" the clock CLK is low. Thus, MPRE turns on and MGS turns off, resulting in precharging of the dynamic node EVAL. The high EVAL node turns on MC1. However, the low CLK turns off MC2, thus instantly disabling the pull-down path of the convertor. Also, MC4 turns off two invertor-delays after CLK goes low.

In the "evaluation phase", the CLK is high. Assuming that the node Y is initialized to high, there are two possibilities in the evaluation phase. The first is the case where EVAL evaluates to high, and the second case is where EVAL evaluates to low. Each is discussed in turn below.

In the first case, either or both of ML1 and ML2 are off (A and/or B is low), and thus the pull-down of the node EVAL via MGS (which is on) is blocked. The logic therefore does not discharge EVAL which stays high, and MC1 remains on. At the convertor, the rise in CLK turns MC2 on and, after two invertor-delays, turns MC4 on, thus activating the pull-down path of the convertor. The static node Y is then discharged to low, and the invertor INVB output goes high.

In the second case, both ML1 and ML2 are on (A and B are high), and thus the pull-down path of the node EVAL via MGS (which is on) is activated and node EVAL begins to discharge. Also, the rise in the clock CLK turns on MC2. However, MC4 initially remains off, disabling the pull-down path of the converter and preventing an initial discharge of node Y. Then, after a delay (Tdc), the drop in EVAL causes MC1 to shut off to also disable the pull-down path of the converter. In addition, after the two inverter-delay of INVC1 and INVC2 (Tda), MC4 turns on. However, the convertor pull-down path is nevertheless blocked by MC1.

Delay Tdc and delay Tda are approximately the same. Therefore, static node Y stays high during the whole evaluation process. That is, the convertor pull down path is initially disabled by MC4 prior to deactivation of MC1, and then disabled by MC1 itself upon a sufficient drop in the potential of node EVAL. Glitching in the node Y potential is prevented or at least minimized since the pull-down path of the converter is not activated during the evaluation phase in the case where EVAL goes to low.

The clk-to-q delay for the flop is now balanced for the two edges as follows, where clk_dly(r) is the two invertor-delay associated with INVC1 and INVC2:

$clk(r) \rightarrow out(r) = clk\_dly(r) + y(f) + out(r) = 2$ gate delay=$Tda+2=1.5+2=$ 3.5 gate delay $clk(r) \rightarrow out(f) = eval(f) + y(r) + out(f) = 3.5$ gate delay=$Tdc+2=1.5+2=$ 3.5 gate delay Thus, the output rising and falling times are matched to avoid or at least minimize glitching. Moreover, the worst case delay of the conventional arrangement has not been sacrificed. Rather, the worst case delay remains the same or almost the same, thereby avoiding any delay penalties associated with the present invention. Further, as mentioned above, in conventional techniques the output buffer INVB is sometimes skewed in an effort to minimize glitching. In the present invention, the INVB sizing is made flexible, and need not be skewed in either direction by selection of high and/or low beta ratios.

Since the load is minimal, INVC1 and INVC2 are preferably small size invertors. Also, for performance reasons, capacitance on the dynamic node EVAL is minimized, and therefore MC1, MC2 and MC4 preferably are not large devices. Further, in a preferred embodiment, the CLK load is minimized by selecting as INVC1 a minimum size invertor that the available technology offers. INVC2 is then sized such that the CLK to clk_dly delay is optimized or minimized. In other words, the fanouts for INVC1 and INVC2 are preferably the same. These inverter sizing rules provide for a relatively simple and clean solution to the glitching problem. It is noted that the 2-inverter delay is about the same as a 1.5 regular gate delay. The 2-inverters have low fanout and are faster than other logic gates.

As suggest above, Tda is the delay that occurs in activating the pull-down path of the convertor after CLK goes high. Tdc is the delay in cutting off the pull-down path of the convertor after CLK goes high, i.e., the time it takes to evaluate the logic. The performance of the invention is sensitive to the relationship between Tda and Tdc as follows:

Tda>Tdc→Delay penalty

Tda<Tdc→Glitching

Tda=Tdc→Slight delay penalty

Optimally, Tda would be designed to be slightly less than Tdc to remove or minimize any delay penalty, notwithstanding the potential for a minimal amount of glitching. This is because a very small amount of glitching is tolerable and does not adversely affect performance.

Figure 1:
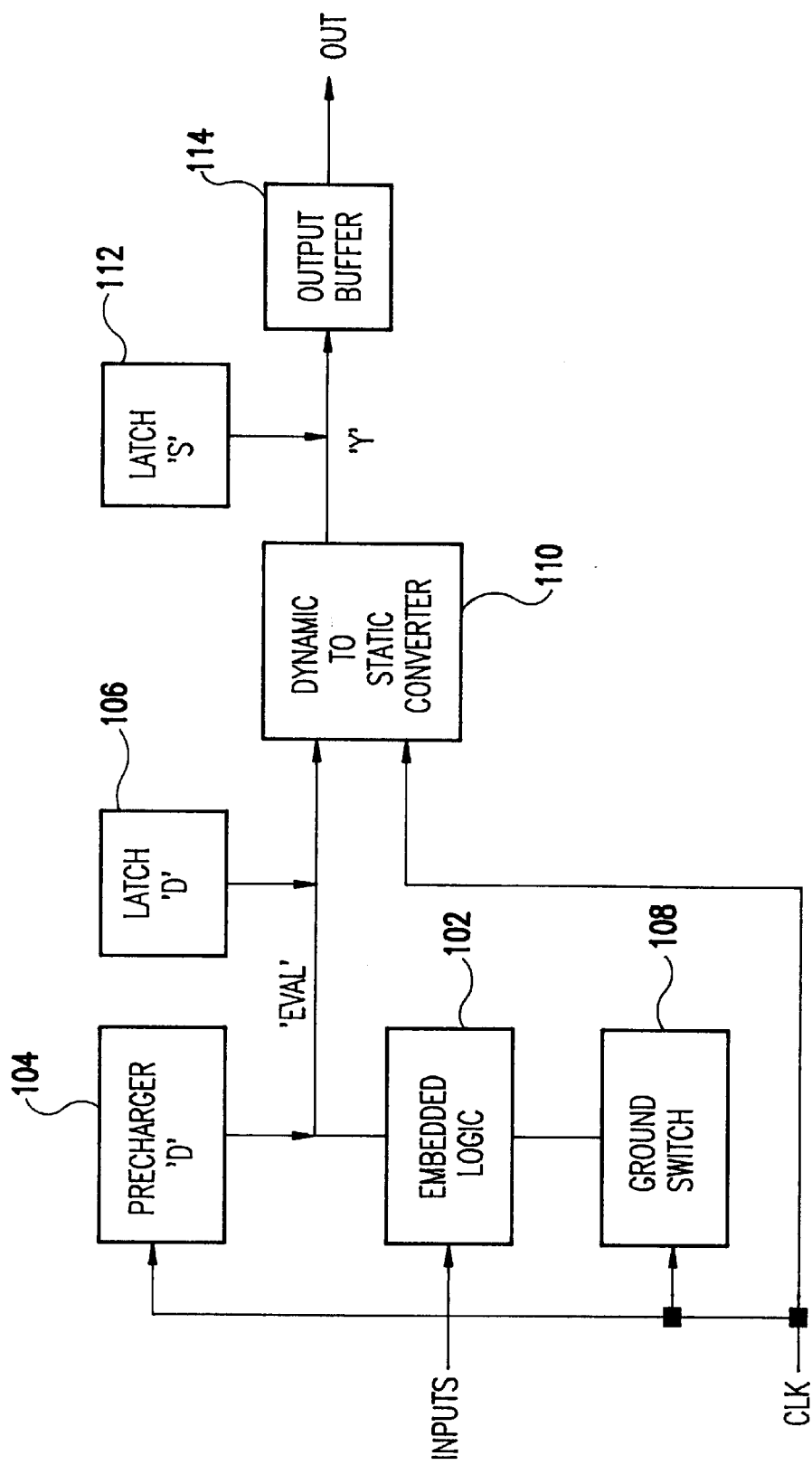
FIG. 1 is a functional block diagram of a conventional staticized flop circuit.
Figure 2:
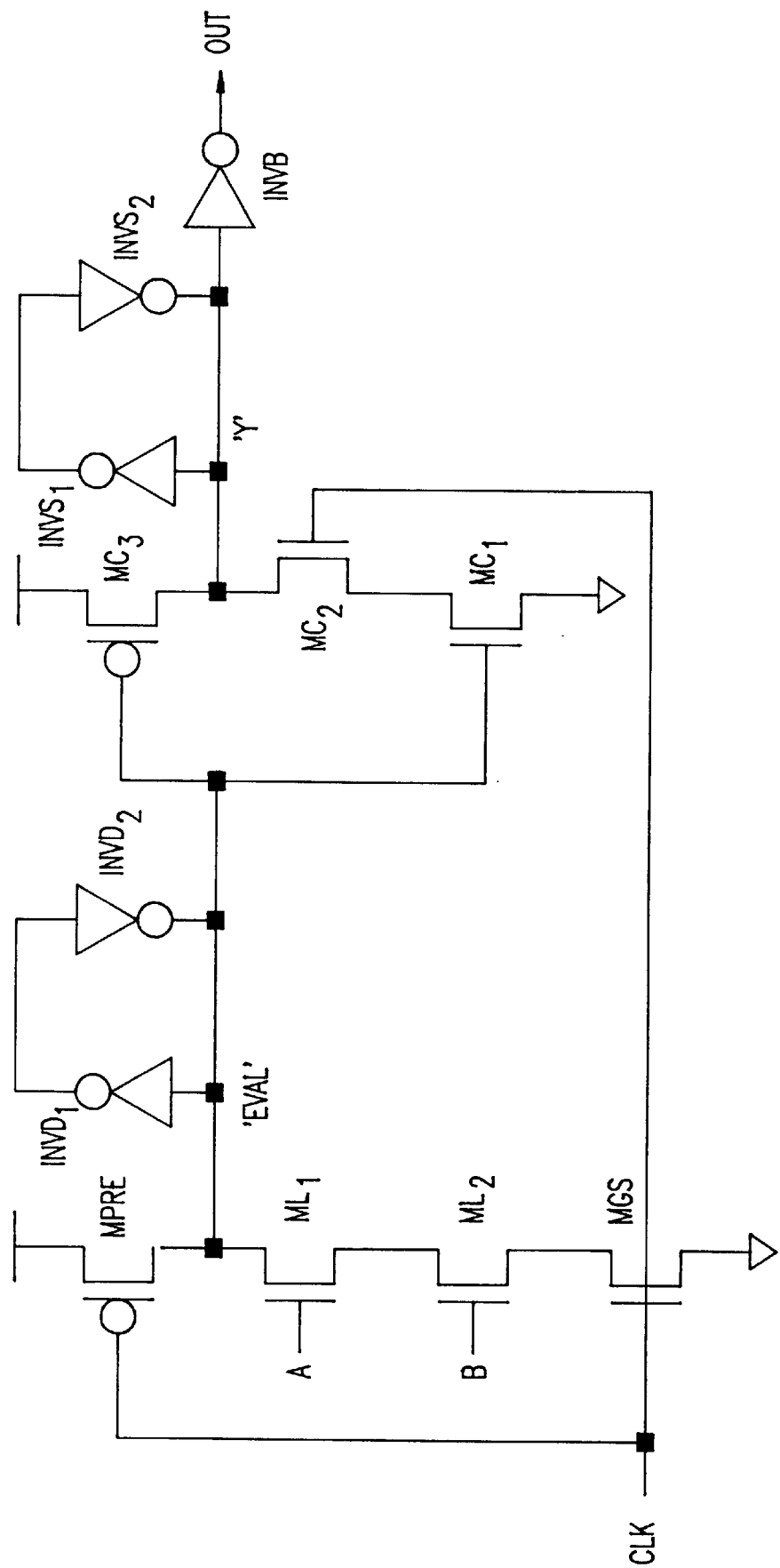
FIG. 2 is an exemplary component level diagram of the staticized flop circuit shown in FIG. 1.
Figure 3A:
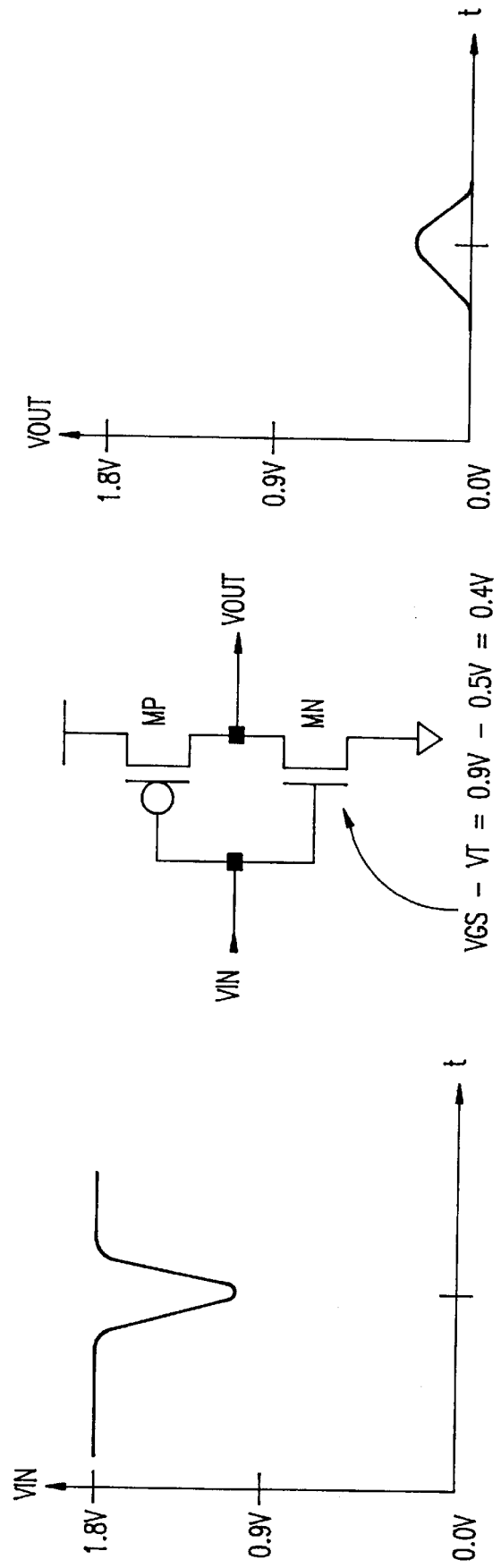
Figure 7A:
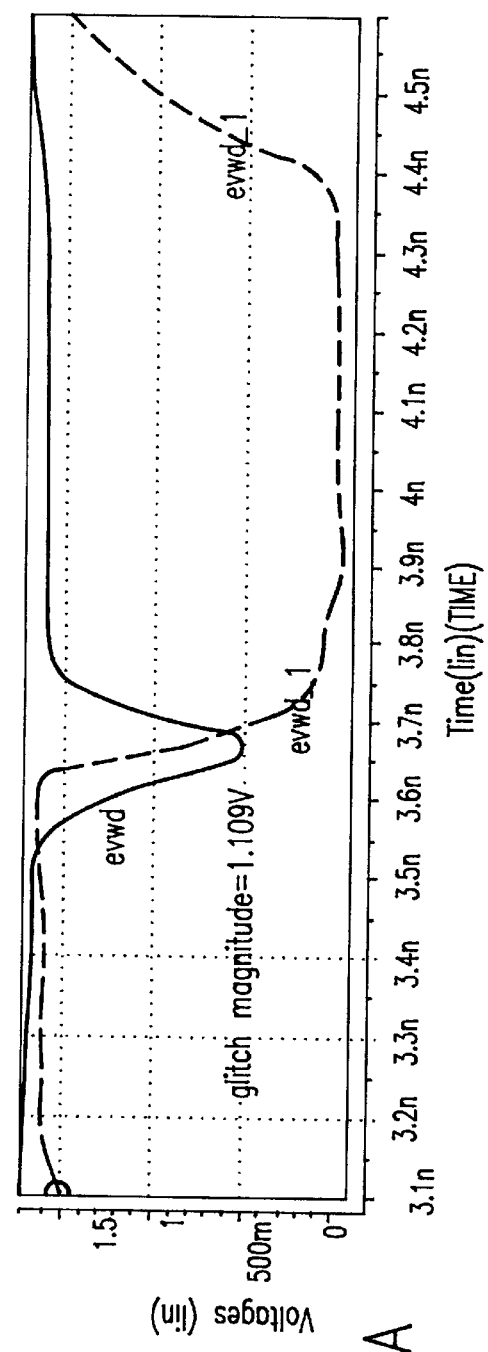
FIG. 7(a) is a waveform diagram showing the relationship between the potentials at dynamic node EVAL and static node Y according to the conventional device of FIGS. 1 and 2.
Figure 7B:
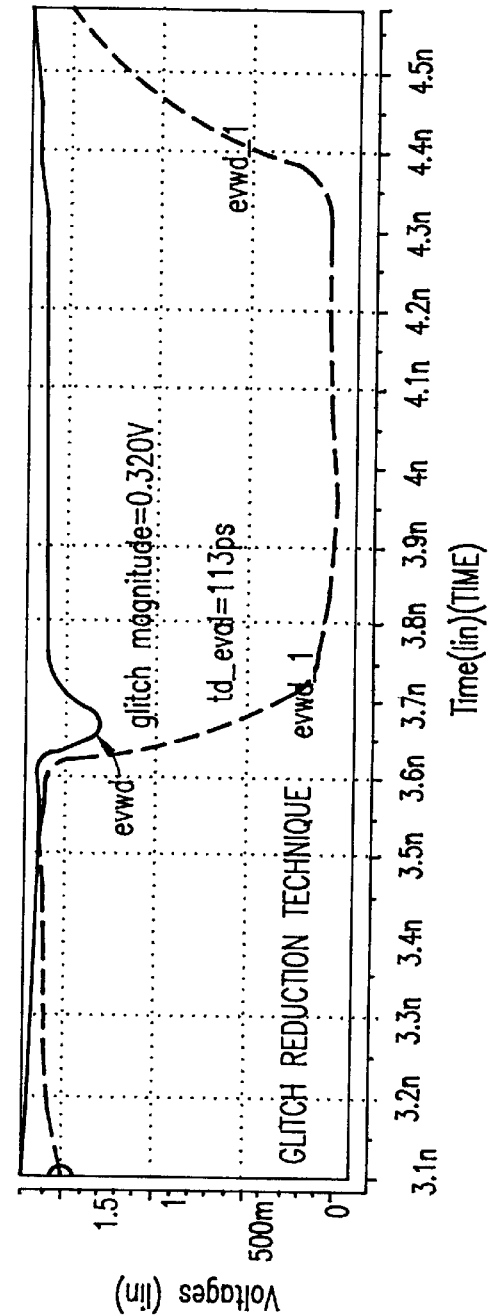
FIG. 7(b) is a waveform diagram of the same according to the present invention of FIGS. 5 and 6.

FIG. 7(a) is a waveform diagram showing the relationship between the potentials at dynamic node EVAL and static node Y according to the conventional device described in connection with FIGS. 1 and 2, and FIG. 7(b) is a waveform diagram of the same according to the present invention. Each shows the case where node Y is initialized to high, and EVAL is evaluated low. As shown in FIG. 7(a), node Y begins its discharge prior to the discharging of node EVAL. By the time EVAL drops to a low potential (i.e., a threshold potential) which is sufficient to deactivate the convertor pull-down path, node Y has suffered a glitch of approximately 1.1v. In contrast, in the present invention as shown in FIG. 7(b), the discharge of node Y may be prohibited until after node EVAL begins its discharge. Thus, EVAL drops to the threshold potential prior to an excessive drop in the node Y potential, and the glitch magnitude is limited to approximately 0.3v.

The present invention has been described in detail in the context of specific embodiments. However, it should be understood that the invention is to be construed in light of the appended claims rather than the specifically disclosed embodiments, and that various modification will become apparent to those of ordinary skill in the art without departing from the spirit and scope of the invention as defined by the appended claims.

What is claimed is:

1. A dynamic-to-static convertor comprising:
    a pull-down switch device, operatively coupled between an output node and a ground, which is closed while an input node is at a precharge potential and which is open while the input node is at a ground potential;
    a pull-up switch device, operatively coupled between a source voltage and the output node, which is closed while the input node is at the ground potential and which is open while the input node is at the precharge potential;
    a pull-down path shutoff switch device, receiving a clock signal and being operatively coupled in series between said pull-down switch device and the ground, which is closed during each first phase of a clock signal and which is open during each second phase of the clock signal;
    a delay circuit which receives and delays the clock signal by a delay which is less than a clock period to obtain a delayed clock signal having first and second delayed phases which are delayed by said delay relative to the first and second phases of the clock signal; and
    an activation switch device, receiving said delayed clock signal and being operatively coupled between the output node and said pull-down switch device, which is closed during each first delayed phase of the delayed clock signal and which is open during each second delayed phase of the delayed clock signal.

2. A dynamic-to-static convertor as claimed in claim 1, wherein said delay circuit is comprised of a series connection of first and second invertors.

3. A dynamic-to-static convertor as claimed in claim 1, wherein said pull down switch device is a first transistor having a gate coupled to said input node, wherein said pull-up switch device is a second transistor having a gate coupled to said input node, wherein said pull-down path shutoff switch device is a third transistor having a gate which receives the clock signal, and wherein said activation switch device is a fourth transistor having a gate which receives the delayed clock signal.

4. A dynamic-to-static convertor as claimed in claim 2, wherein said pull down switch device is a first transistor having a gate coupled to said input node, wherein said pull-up switch device is a second transistor having a gate coupled to said input node, wherein said pull-down path shutoff switch device is a third transistor having a gate which receives the clock signal, and wherein said activation switch device is a fourth transistor having a gate coupled to an output of said series connection of first and second invertors.

5. A staticized flip-flop circuit which converts a dynamic signal appearing across an output of a logic circuit into a static signal, the output having at least first and second terminals, said staticized flip-flop circuit comprising:
    a precharger which receives a clock signal having first and second phases and which is activated during each second phase of said clock signal to charge a first node to a precharged potential and which is deactivated during each first phase of the clock signal, the first node being coupled to the first terminal of the output of the logic circuit;
    a ground switch which is activated during each first phase of the clock signal to ground the second terminal of the logic circuit and which is deactivated during each second phase of the clock signal; and
    a dynamic-to-static convertor connected between said first node and a second node, said dynamic-to-static converter comprising:
        (a) a pull-down switch device, operatively coupled between the second node and the ground, which is closed while the first node is at the precharge potential and which is open while the first node is at a ground potential;
        (b) a pull-up switch device, operatively coupled between a source voltage and the second node, which is closed while the first node is at the ground potential and which is open while the first node is at the precharge potential;
        (c) a pull-down path shutoff switch device, receiving a clock signal and being operatively coupled in series between said pull-down switch device and the ground, which is closed during the first phase of a clock signal and which is open during the second phase of the clock signal;
        (d) a delay circuit which receives and delays the clock signal by a delay which is less than a clock period to provide a delayed clock signal having first and second delayed phases which are delayed by said delay relative to the first and second phases of the clock signal; and
        (e) an activation switch device, receiving said delayed clock signal and being operatively coupled between said second node and said pull-down switch device, which is closed during each first delayed phase of the delayed clock signal and which is open during each second delayed phase of the delayed clock signal.

6. A staticized flip-flop circuit as claimed in claim 5, further comprising a first latch coupled to said first node and a second latch coupled to said second node.

7. A staticized flip-flop circuit as claimed in claim 5, further comprising an output buffer coupled to said second node.

8. A staticized flip-flop circuit as claimed in claim 6, further comprising an output buffer coupled to said second node.

9. A staticized flip-flop circuit as claimed in claim 5, wherein said delay circuit is comprised of a series connection of first and second invertors.

10. A staticized flip-flop circuit as claimed in claim 5, wherein said pull down switch device is a first transistor having a gate coupled to said first node, wherein said pull-up switch device is a second transistor having a gate coupled to said first node, wherein said pull-down path shutoff switch device is a third transistor having a gate which receives the clock signal, and wherein said activation switch device is a fourth transistor having a gate which receives the delayed clock signal.

11. A staticized flip-flop circuit as claimed in claim 5, wherein said pull down switch device is a first transistor having a gate coupled to said first node, wherein said pull-up switch device is a second transistor having a gate coupled to said first node, wherein said pull-down path shutoff switch device is a third transistor having a gate which receives the clock signal, and wherein said activation switch device is a fourth transistor having a gate coupled to an output of said series connection of first and second invertors.

* * * * *